United States Patent
Chang et al.

(10) Patent No.: US 11,417,511 B1
(45) Date of Patent: Aug. 16, 2022

(54) METHOD FOR DRYING WAFER AT ROOM TEMPERATURE

(71) Applicant: NATIONAL SUN YAT-SEN UNIVERSITY, Kaohsiung (TW)

(72) Inventors: Ting-Chang Chang, Kaohsiung (TW);
Chih-Cheng Yang, Kaohsiung (TW);
Wen-Chung Chen, Kaohsiung (TW);
Chuan-Wei Kuo, Kaohsiung (TW);
Pei-Yu Wu, Kaohsiung (TW);
Chun-Chu Lin, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 17/383,748

(22) Filed: Jul. 23, 2021

(30) Foreign Application Priority Data

May 26, 2021 (TW) .................................. 110119096

(51) Int. Cl.
*H01L 21/02* (2006.01)
*F26B 5/00* (2006.01)
*B08B 3/10* (2006.01)
*B08B 3/08* (2006.01)

(52) U.S. Cl.
CPC .......... *H01L 21/02041* (2013.01); *B08B 3/08* (2013.01); *B08B 3/10* (2013.01); *F26B 5/005* (2013.01)

(58) Field of Classification Search
CPC ....... H01L 21/02041; B08B 3/08; B08B 3/10; F26B 5/005
See application file for complete search history.

(56) References Cited

U.S. PATENT DOCUMENTS

| | | | |
|---|---|---|---|
| 9,534,839 B2 | 1/2017 | Lee et al. | |
| 10,361,100 B2 | 7/2019 | Lee et al. | |
| 2004/0134515 A1* | 7/2004 | Castrucci | H01L 21/02063 257/E21.228 |
| 2011/0220152 A1* | 9/2011 | Kitajima | H01L 21/67028 134/26 |
| 2013/0318812 A1* | 12/2013 | Kim | F26B 5/005 34/201 |

* cited by examiner

*Primary Examiner* — Erin F Bergner
(74) *Attorney, Agent, or Firm* — WPAT, PC

(57) ABSTRACT

A method for drying a wafer at room temperature includes a cleaning step, a reacting step and a pressure releasing step. The cleaning step includes putting a processing workpiece into a cleaning solvent. The reacting step includes putting the processing workpiece along with the cleaning solvent into a reaction chamber, implanting a supercritical fluid into the reaction chamber, and increasing a pressure of the reaction chamber to dissolve the cleaning solvent in the supercritical fluid. A critical temperature of the supercritical fluid is below room temperature. The pressure releasing step includes releasing the pressure of the reaction chamber and discharging the supercritical fluid together with the cleaning solvent out of the reaction chamber, after completely dissolving the cleaning solvent in the supercritical fluid.

5 Claims, 2 Drawing Sheets

METHOD FOR DRYING WAFER AT ROOM TEMPERATURE

CROSS REFERENCE TO RELATED APPLICATION

The application claims the benefit of Taiwan application serial No. 110119096, filed on May 26, 2021, and the entire contents of which are incorporated herein by reference.

BACKGROUND OF THE INVENTION

1. Field of the Invention

The present invention generally relates to a semiconductor manufacturing process and, more particularly, to a method for drying a wafer at room temperature to avoid the collapse of the crystal grain structure after cleaning.

2. Description of the Related Art

The semiconductor industry has been dedicated to miniaturizing electronic components and metal line widths, to maximize the area utilization of a wafer. The semiconductor manufacturing process can produce a laminated transistor structure by repeatedly stacking materials on the wafer, coating photoresist, and etching after exposure. Before each stacking step, it is necessary to remove the photoresist and etch polymer of the previous step to prevent the residual materials from isolating or interfering the electrical connection with the subsequent laminated materials, which results in electrical components with poor electrical properties. In particular, the residual materials in the channel structure are difficult to be removed completely, so that it is required to use a wet cleaning method to remove them and then dry the wafer.

Referring to FIG. 1, the conventional method for drying a wafer takes the solvent S for cleaning the wafer together with impurities away from the surface structure of the transistor T. However, the gradually miniaturized semiconductor components make the transistors T to be arranged on the wafer as densely as possible, Fin Field-Effect Transistor (FinFET) is an example of such arrangement. The adjacent transistors T are extremely close in structure, as shown in FIG. 1. Therefore, when the solvent S leaves the channel between the transistors T, the surface tension of the solvent S pulls the transistors T on both sides and causes the structure collapse of the transistors T during the drying process, thereby reducing the quality of the semiconductor components. A conventional method for drying a wafer includes using spin dryer with centrifugal force, solvent vaporization drying, etc. However, this method cannot prevent the collapse of the crystal grains and is not suitable for advanced process in miniaturized structure. In addition, the conventional method for drying microstructures includes solidifying the cleaning liquid and removing it by sublimation, replacing the cleaning liquid with resin and decomposing it by heating, supersonic vibration spraying, etc. However, these require complicated steps, expensive equipment to perform, heating to raise the process temperature, or consuming a lot of chemicals, resulting in increased production cost and prolonged cleaning and drying process time.

In light of the above problem, it is necessary to improve the conventional method for drying a wafer.

SUMMARY OF THE INVENTION

To solve the problems mentioned above, it is therefore an objective of the present invention to provide a method for drying a wafer at room temperature, which can prevent from damaging the wafer structure after drying.

It is another objective of the present invention to provide a method for drying a wafer at room temperature, which can simplify the flow of wafer cleaning and drying.

It is yet another objective of the present invention to provide a method for drying a wafer at room temperature, which can reduce the production cost.

As used herein, the term "one", "a" or "an" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

A method for drying a wafer at room temperature includes cleaning step, a reacting step and a pressure releasing step. The cleaning step includes putting a processing workpiece into a cleaning solvent. The reacting step includes putting the processing workpiece along with the cleaning solvent into a reaction chamber, implanting a supercritical fluid into the reaction chamber, and increasing a pressure of the reaction chamber to dissolve the cleaning solvent in the supercritical fluid. A critical temperature of the supercritical fluid is below room temperature. The pressure releasing step includes releasing the pressure of the reaction chamber and discharging the supercritical fluid together with the cleaning solvent out of the reaction chamber, after completely dissolving the cleaning solvent in the supercritical fluid.

Accordingly, the method for drying the wafer at room temperature according to the present invention utilizes the supercritical fluid to dry the processing workpiece. Since the supercritical fluid has the characteristics of no surface tension, capable of dissolving the cleaning solvent, and working at room temperature, it can keep the processing workpiece structure intact after drying. Furthermore, it does not require heating in the drying process, ensuring the effects of improving wafer product yield rate, increasing process efficiency and reducing production cost.

In an example, the supercritical fluid is carbon tetrafluoride, nitrogen, argon or hydrogen. As such, the supercritical fluid can keep supercritical characteristics in a room temperature environment, ensuring the effect of improving drying efficiency.

In an example, a flow rate of the supercritical fluid ranges from 10 ml to 200 ml per minute. As such, the density of the supercritical fluid and the solubility of the substance in the supercritical fluid are adjustable, ensuring the effect of controlling the cleaning and dissolution rate.

In an example, the pressure of the reaction chamber ranges from 300 psi to 30000 psi. As such, the characteristics such as viscosity, diffusion and solubility of the supercritical fluid in the reaction chamber can be fine-tuned, ensuring the effect of adjusting the fluid characteristics according to the working environment and the type of substance.

In an example, the temperature of the reaction chamber ranges from 10° C. to 30° C. As such, the reaction chamber can work at room temperature without performing heating and thermal isolation steps, ensuring the effect of simplifying process and saving energy during drying.

In an example, the cleaning solvent is isopropanol, acetone, ethanol or hexane. As such, the surface tension of the cleaning solvent is low, ensuring the effect of reducing the probability of damaging the wafer structure.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

A method for drying a wafer at room temperature according to a preferred embodiment includes a cleaning step, a reacting step and a pressure releasing step.

Figure 1:
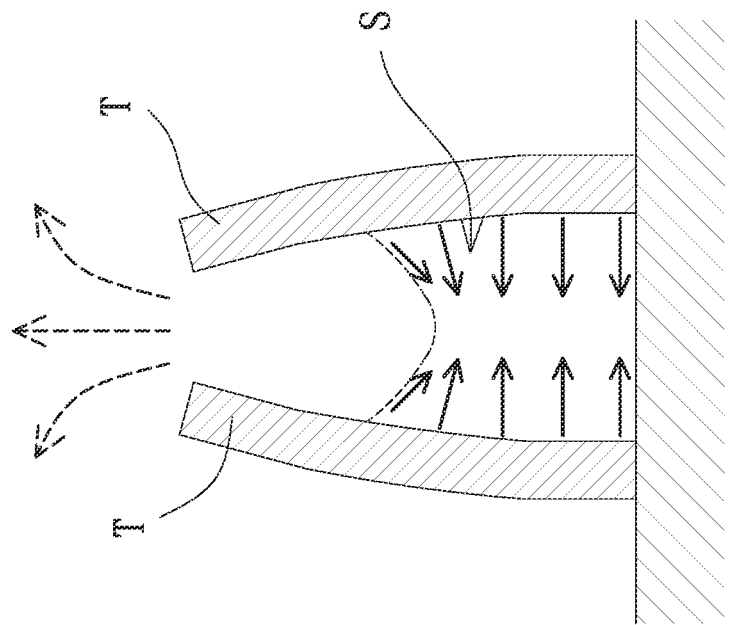
FIG. 1 is a cross-sectional view of a wafer structure defect caused by a conventional method for drying a wafer.
Figure 1:
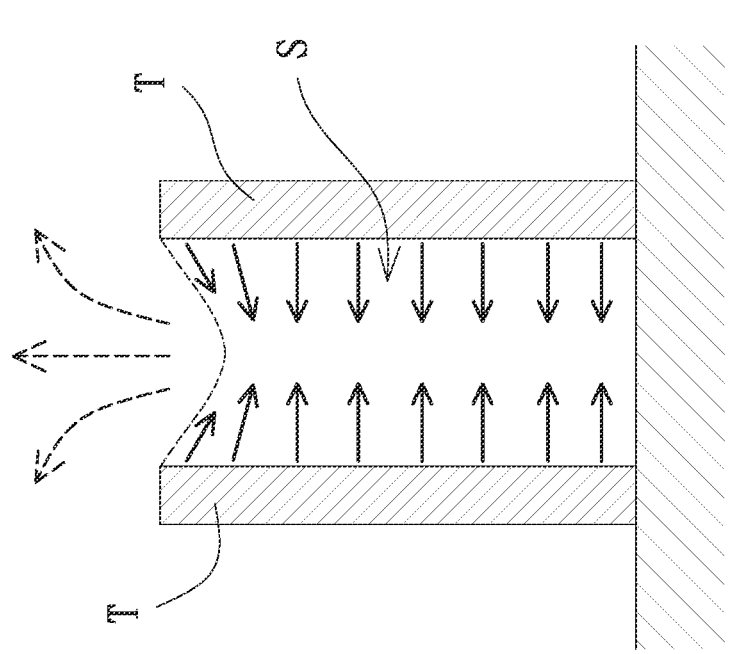
Figure 2:
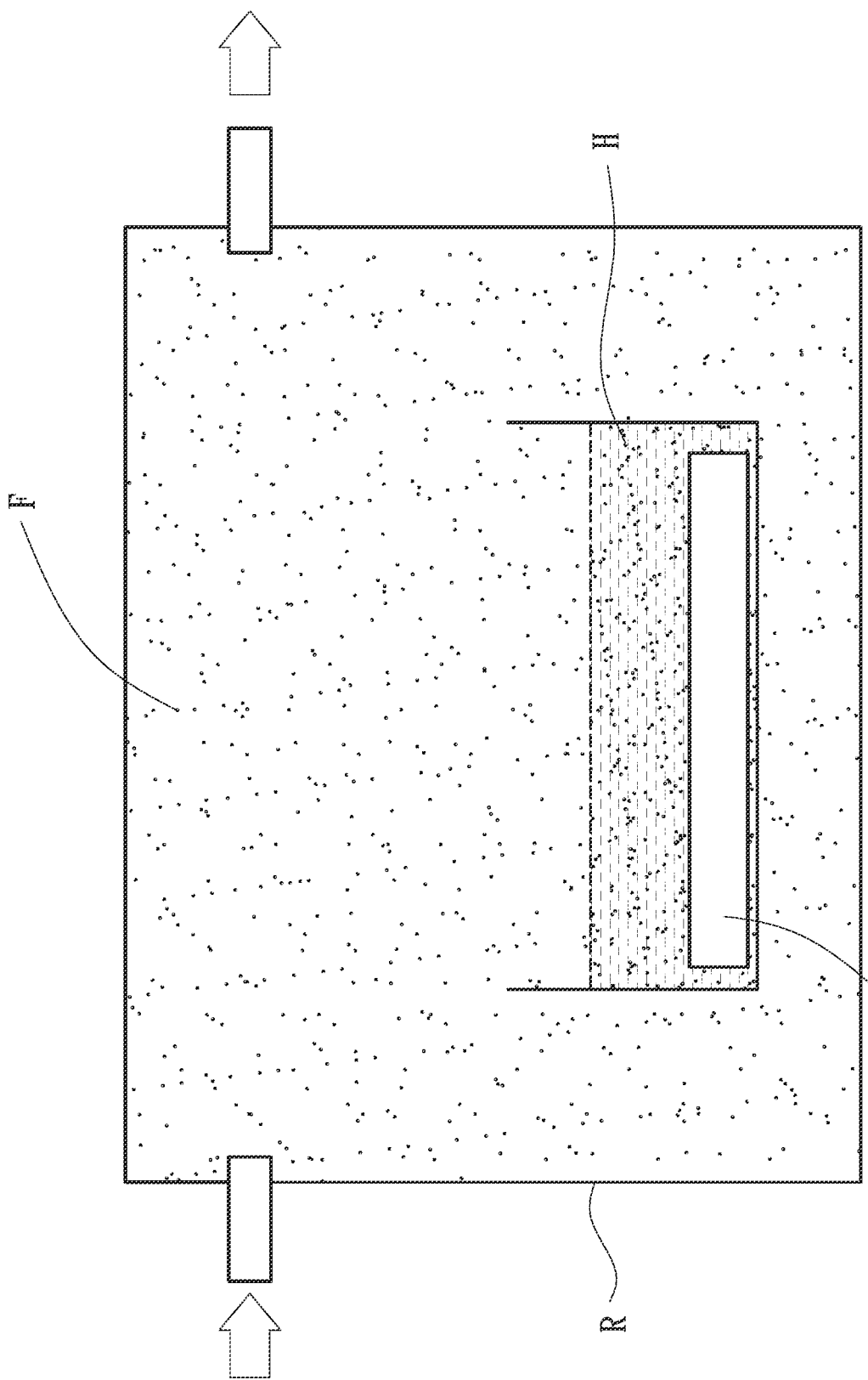
FIG. 2 is a schematic view of a manufacturing process according to a preferred embodiment of the present invention.

Referring to FIG. 2, the cleaning step includes putting a processing workpiece W into a cleaning solvent H. The processing workpiece W can be a wafer after an etching process and can have a semi-finished integrated circuit on a surface thereof. The photoresist and etching polymer are residual on the surface and a channel of the integrated circuit pattern. The cleaning solvent H can be a low surface tension solvent such as isopropanol, acetone, ethanol or hexane. Thus, the residual materials on the processing workpiece W are immersed below the liquid surface of the cleaning solvent H to clean the wafer.

The reacting step includes putting the processing workpiece W along with the cleaning solvent H into a reaction chamber R and implanting a supercritical fluid F into the reaction chamber R, so that the supercritical fluid F reacts with the cleaning solvent H at room temperature and the cleaning solvent H can be dissolved in the supercritical fluid F. Furthermore, by increasing the pressure of the reaction chamber R, the solubility of the cleaning solvent H in the supercritical fluid F can be increased. The flow rate of the supercritical fluid F can range from 10 ml to 200 ml per minute. The dissolving reaction time of the cleaning solvent H can range from 10 minutes to 60 minutes. The temperature of the reaction chamber can range from 10° C. to 30° C. The pressure of the reaction chamber can range from 300 psi to 30000 psi. The supercritical fluid F can be a fluid with critical temperature below room temperature, such as carbon tetrafluoride ($CF_4$), nitrogen ($N_2$), argon (Ar), hydrogen ($H_2$), etc. Normal temperature or room temperature is defined as 25° C. or 300 K (Kelvin), in which 300 K is about 27° C.

In the pressure releasing step, after the cleaning solvent H is completely dissolved in the supercritical fluid F, release the pressure of the reaction chamber R, and discharge the supercritical fluid F together with the cleaning solvent H out of the reaction chamber R. Since the supercritical fluid F has replaced the cleaning solvent H on the surface of the processing workpiece W, the characteristic of no surface tension of the supercritical fluid F is utilized, such that the supercritical fluid F leaves the surface of the processing workpiece W without damaging the integrated circuit structure when drying the wafer.

In this embodiment, isopropanol is chosen as the cleaning solvent H, the temperature of the reaction chamber R is set to 25° C., and the pressure of the reaction chamber R is set to 3000 psi. Then, implant fluids of different components into the reaction chamber R respectively and observe the structure changes of the integrated circuit on the processing workpiece W after drying with different fluids.

TABLE 1

| Wafer drying test at room temperature | | | | |
|---|---|---|---|---|
| Temperature | Pressure | Cleaning solvent | Fluid type | Structure collapse rate |
| 25° C. | 3000 psi | isopropanol | $CO_2$ | 80% |
|  |  |  | $CF_4$ | 0% |

Please refer to Table 1, which shows the test results of the method for drying the wafer at room temperature using carbon dioxide and carbon tetrafluoride as implanting fluids, respectively. Since the critical temperature of carbon dioxide is 31.1° C., the carbon dioxide cannot reach the supercritical state in the working environment of room temperature. Thus, the surface tension of the carbon dioxide fluid would pull the transistor structure on the wafer and result in a structure collapse rate of 80%. However, the carbon tetrafluoride has the critical temperature below room temperature and reaches the supercritical state without heating, which can dry the wafer in the environment of room temperature without making the structure collapse.

According to the comparison results above, the fluid with a critical temperature below room temperature can be utilized to clean and dry wafers at room temperature. The reaction chamber R does not require installations of a heating device or a thermal isolation layer. Thus, it saves time and energy for the reaction chamber R to reach the critical temperature.

Based on the above, the method for drying the wafer at room temperature according to the present invention utilizes the supercritical fluid to dry the processing workpiece. Since the supercritical fluid has the characteristics of no surface tension, capable of dissolving the cleaning solvent, and working at room temperature, it can keep the processing workpiece structure intact after drying. Furthermore, it does not require heating in the drying process, ensuring the effects of improving wafer product yield rate, increasing process efficiency and reducing production cost.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A method for cleaning a FinFET structure on a wafer, comprising:
    a cleaning step including putting a processing workpiece including the FinFET structure into a cleaning solvent;
    a reacting step including putting the processing workpiece along with the cleaning solvent into a reaction chamber, implanting a supercritical fluid into the reaction chamber, at a flow rate ranging from 10 ml to 200 ml per minute and increasing a pressure of the reaction chamber to dissolve the cleaning solvent in the supercritical fluid, at a temperature from 10° C. to 30° C.; and
    a pressure releasing step including releasing the pressure of the reaction chamber to be equal to an environmental pressure, and discharging the supercritical fluid together with the cleaning solvent out of the reaction chamber, after completely dissolving the cleaning solvent in the supercritical fluid.

2. The method according to claim 1, wherein the supercritical fluid is carbon tetrafluoride, nitrogen, argon or hydrogen.

3. The method according to claim 1, wherein in the reacting step, the pressure-of the reaction chamber is increased to a range from 300 psi to 30000 psi to dissolve the cleaning solvent in the supercritical fluid.

4. The method according to claim 1, wherein the cleaning solvent is isopropanol, acetone, ethanol, or hexane.

5. A method for cleaning a FinFET structure on a wafer, consisted of:
- a cleaning step including putting a processing workpiece including the FinFET structure into a cleaning solvent;
- a reacting step including putting the processing workpiece along with the cleaning solvent into a reaction chamber, implanting a supercritical fluid into the reaction chamber, at a flow rate ranging from 10 ml to 200 ml per minute and increasing a pressure of the reaction chamber to dissolve the cleaning solvent in the supercritical fluid, at a temperature from 10° C. to 30° C.; and
- a pressure releasing step including releasing the pressure of the reaction chamber to be equal to an environmental pressure, and discharging the supercritical fluid together with the cleaning solvent out of the reaction chamber, after completely dissolving the cleaning solvent in the supercritical fluid.

* * * * *